United States Patent
Ho et al.

(10) Patent No.: US 10,874,016 B2
(45) Date of Patent: Dec. 22, 2020

(54) METHOD OF MANUFACTURING PHYSICAL STRUCTURE FOR HIGH FREQUENCY SIGNAL TRANSMISSION

(71) Applicants: Avary Holding (Shenzhen) Co., Limited., Shenzhen (CN); HongQiSheng Precision Electronics (QinHuangDao) Co., Ltd., Qinhuangdao (CN)

(72) Inventors: Ming-Jaan Ho, New Taipei (TW); Hsiao-Ting Hsu, New Taipei (TW)

(73) Assignees: Avary Holding (Shenzhen) Co., Limited., Shenzhen (CN); HongQiSheng Precision Electronics (QinHuangDao) Co., Ltd., Qinhuangdao (CN)

( * ) Notice: Subject to any disclaimer, the term of this patent is extended or adjusted under 35 U.S.C. 154(b) by 0 days.

(21) Appl. No.: 16/577,062

(22) Filed: Sep. 20, 2019

(65) Prior Publication Data

US 2020/0015352 A1 Jan. 9, 2020

Related U.S. Application Data

(62) Division of application No. 15/275,481, filed on Sep. 26, 2016, now abandoned.

(30) Foreign Application Priority Data

Jun. 7, 2016 (CN) .......................... 2016 1 0397198

(51) Int. Cl.
*H05K 3/02* (2006.01)
*H05K 3/10* (2006.01)
(Continued)

(52) U.S. Cl.
CPC ............. *H05K 1/0237* (2013.01); *H05K 3/06* (2013.01); *H05K 3/108* (2013.01); *H05K 3/188* (2013.01);
(Continued)

(58) Field of Classification Search
CPC ........ H05K 1/0237; H05K 3/108; H05K 3/06; H05K 3/188; H05K 3/24; H05K 3/244;
(Continued)

(56) References Cited

U.S. PATENT DOCUMENTS

| 4,866,008 A * | 9/1989 | Brighton | ........... H01L 21/76886 438/622 |
| 5,332,693 A * | 7/1994 | Kim | .................. H01L 23/53223 438/648 |
| 6,608,535 B2 * | 8/2003 | Sherman | .................. H01P 5/16 333/128 |

FOREIGN PATENT DOCUMENTS

CN  103249255  8/2013

* cited by examiner

*Primary Examiner* — Donghai D Nguyen
(74) *Attorney, Agent, or Firm* — ScienBiziP, P.C.

(57) ABSTRACT

A method for fabricating a sandwiched structure of silver-copper-silver functioning as a high frequency signal transmission structure includes an insulating sheet and a conductive circuit on the insulating sheet. The conductive circuit includes a silver conductive layer bonded to the insulating sheet, a copper conductive layer formed on the silver conductive layer, and a silver covering layer laid to cover top and side surfaces of the copper conductive layer. The silver conductive layer and the silver covering layer together enclose the copper conductive layer and the higher conductivity of the silver together with the skin effect improves high-frequency transmission efficiency of the copper.

13 Claims, 4 Drawing Sheets

(51) Int. Cl.
　　　*H05K 1/02*　　　(2006.01)
　　　*H05K 3/06*　　　(2006.01)
　　　*H05K 3/18*　　　(2006.01)
　　　H05K 3/24　　　(2006.01)
　　　H05K 1/03　　　(2006.01)
　　　H05K 1/09　　　(2006.01)
(52) U.S. Cl.
　　　CPC .............. *H05K 1/0326* (2013.01); *H05K 1/09* (2013.01); *H05K 3/244* (2013.01); *Y10T 29/49155* (2015.01)
(58) Field of Classification Search
　　　CPC ............... H05K 1/09; H05K 2203/072; H05K 2203/0723; H01L 21/76886; Y10T 29/49155
　　　USPC .......................................................... 29/846
　　　See application file for complete search history.

METHOD OF MANUFACTURING PHYSICAL STRUCTURE FOR HIGH FREQUENCY SIGNAL TRANSMISSION

This application is a divisional application of a commonly-assigned application entitled "HIGH FREQUENCY SIGNAL TRANSMISSION STRUCTURE AND METHOD FOR SAME", filed on 2016 Sep. 26 with application Ser. No. 15/275,481. The disclosure of the above-identified application is incorporated herein by reference.

FIELD

The subject matter herein generally relates to wireless communications.

BACKGROUND

Copper is generally used in manufacturing conductive wire layer; however, large signal losses occur when the copper conductive wire layer is used to transmit a high frequency signal.

BRIEF DESCRIPTION OF THE DRAWINGS

Implementations of the present technology will now be described, by way of example only, with reference to the attached figures.

DETAILED DESCRIPTION

Figure 1:
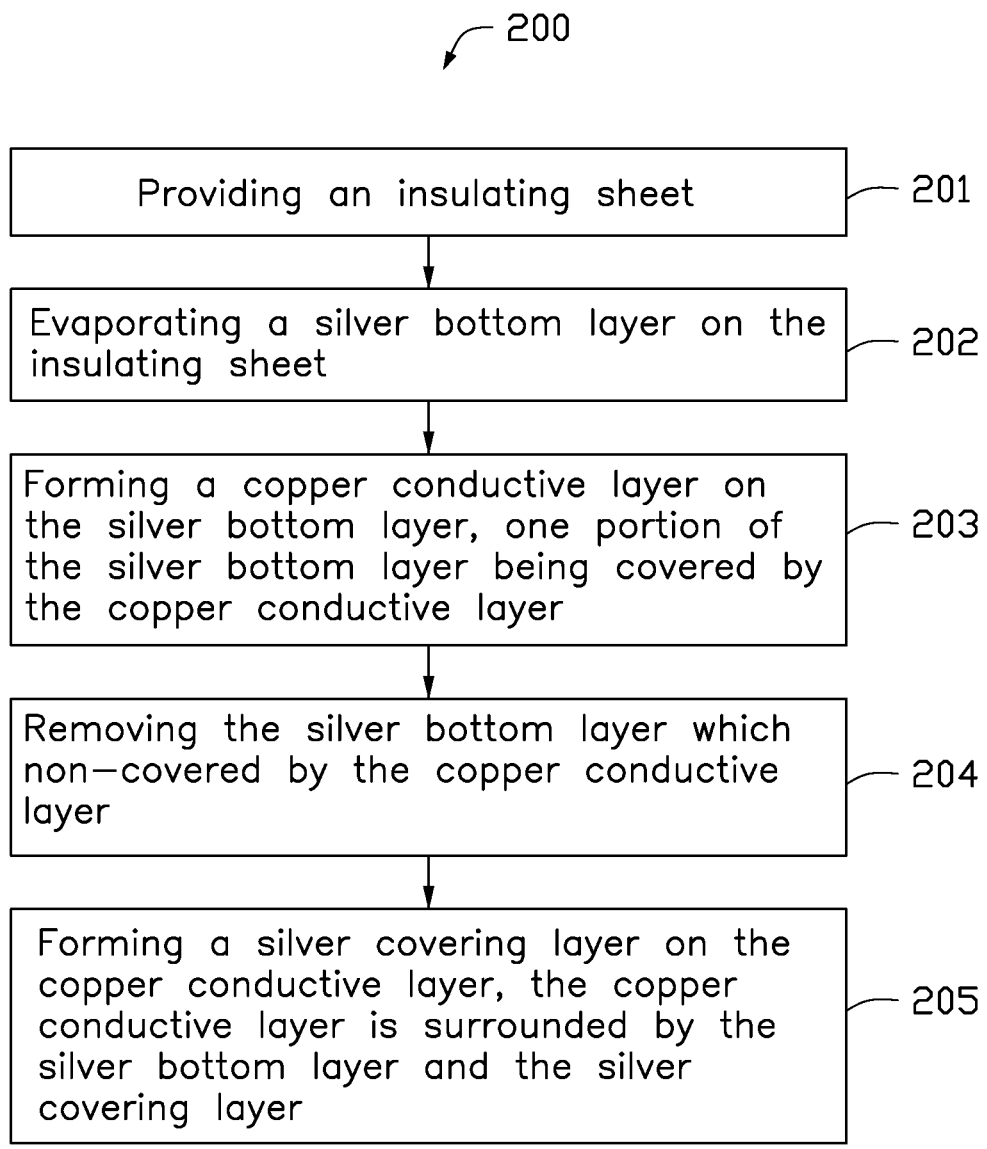
FIG. 1 is a flowchart of a method for manufacturing a high frequency signal transmission structure in accordance with a first embodiment.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

Several definitions that apply throughout this disclosure will now be presented.

The term "substantially" is defined to be essentially conforming to the particular dimension, shape, or other feature that the term modifies, such that the component need not be exact. For example, "substantially cylindrical" means that the object resembles a cylinder, but can have one or more deviations from a true cylinder. The term "comprising," when utilized, means "including, but not necessarily limited to"; it specifically indicates open-ended inclusion or membership in the so-described combination, group, series, and the like. The references "a plurality of" and "a number of" mean "at least two."

Figure 10:
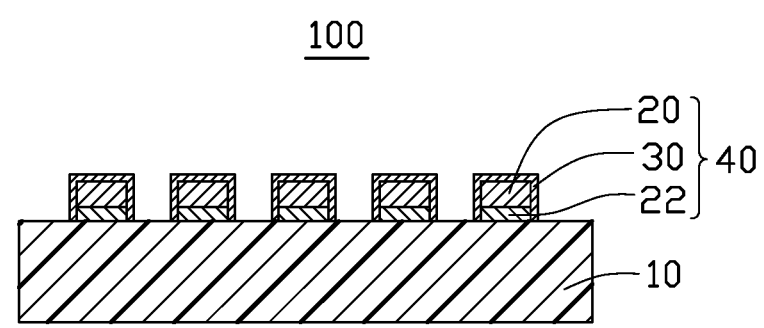
FIG. 10 is a diagrammatic view of a silver covering layer formed on the copper conductive layer to obtain a high frequency signal transmission structure.

FIG. 10 illustrates a high frequency signal transmission structure 100 according to a first embodiment. The high frequency signal transmission structure 100 includes an insulating sheet 10 and a conductive circuit 40 formed on the insulating sheet 10.

A material of the insulating sheet 10 is selected from the group consisting of polynaphthalene dicarboxylic acid glycol ester (PEN), polyimide (PI), and polyterephthalate (PET). The conductive circuit 40 includes a silver conductive layer 22 formed on the insulating sheet 10, a copper conductive layer 20 formed on the silver conductive layer 22, and a silver covering layer 30 covering a top surface and side surfaces of the copper conductive layer 20. The copper conductive layer 20 is sandwiched between the silver conductive layer 22 and the silver covering layer 30. A thickness of the silver conductive layer 22 is about 0.1~2 nanometers. A thickness of the silver conductive layer 22 is same as thickness of the silver covering layer 30.

An electrical conductivity of silver is about $\sigma=6.17*10^7$ S/m, an electrical conductivity of copper is about $\sigma=5.80*10^7$ S/m. When the high frequency signal transmission structure 100 is used for a high frequency signal, the current of the high frequency signal flowing through the conductive circuit 40 tends to be distributed on a surface of the conductive circuit 40, due to conductive skin effect. Thus the current tends to be distributed on surfaces of the silver conductive layer 22 and of the silver covering layer 30 because the silver layers 22 and 30 enclose the copper conductive layer 20. Since the electrical conductivity of silver is greater than the electrical conductivity of copper, transmission losses are reduced, and an increase is achieved in the transmission efficiency of the high frequency signal.

FIG. 1 illustrates a flowchart of a method (method 200) for manufacturing the structure. The method 200 for manufacturing the high frequency signal transmission structure 100 (shown in FIG. 10) is provided by way of an example, as there are a variety of ways to carry out the method. Additionally, the illustrated order of blocks is by example only and the order of the blocks can change. The method 200 can begin at block 201.

Figure 2:
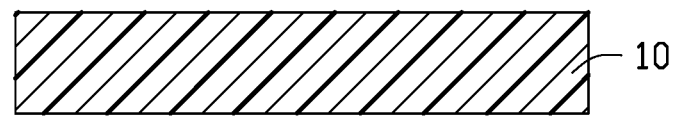
FIG. 2 is a diagrammatic view of an insulating sheet of the structure of FIG. 1.

At block 201, as shown in FIG. 2, an insulating sheet 10 is provided and is pre-treated using a plasma method to strengthen bonding between a silver bottom layer 12 and the insulating sheet 10. The insulating sheet 10 is made from polyester polymer, thus the insulating sheet 10 is comprised of ester group (—COOR). In the illustrated embodiment, the pre-treatment includes first hydrolyzing ester group (—COOR) comprised in the polyester polymer into carboxyl (—COOH) as a first step, the carboxyl (—COOH) then being changed into ester (—COO⁻) in a slightly alkaline environment.

Figure 3:
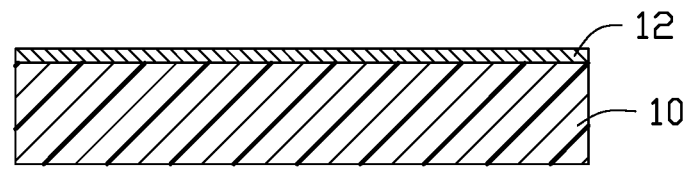
FIG. 3 is a diagrammatic view of a silver bottom layer formed on the insulating sheet of FIG. 2.

At block 202, as shown in FIG. 3, a silver bottom layer 12 is formed on the insulating sheet 10 using a method of vacuum evaporation. Specifically, under a vacuum condition, the insulating sheet 10 is used as a substrate, a metallic silver piece is arranged toward the insulating sheet 10 as a target source. The target source is heated to a high temperature, the metallic silver piece evaporates to silver ions, and the metal silver ions are deposited on the insulating substrate 10. Silver ions and ester group (—COO⁻) on a surface of the insulating sheet 10 form ionic bonds (—COO—Ag), and the bond energy of such ionic bonds can reach about 150-400 kJ/mole. The silver ions can thus adhere to the insulating sheet 10, and the silver bottom layer 12 is thus formed. The heating method can include resistance heating, electron beam heating, laser beam heating, or plasma spray column heating.

At block 203, as shown in FIG. 4 to FIG. 7, a copper conductive layer 20 is formed on the silver bottom layer 12. One portion of the silver bottom layer 12 is covered by the copper conductive layer 20, and the other portion is exposed. In the illustrated embodiment, the copper conductive layer 20 is formed using electroplating method, rather than by a traditional wet etching process. Using an electroplating method to form the copper conductive layer 12 reduces use of copper liquids, and is more environmentally friendly.

Figure 4:
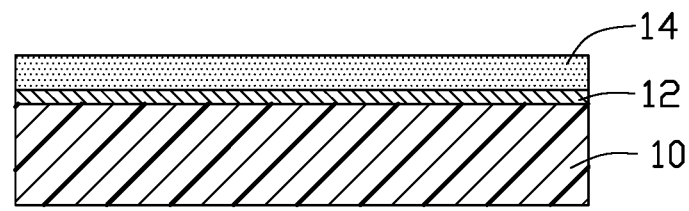
FIG. 4 is a diagrammatic view of a dry film formed on the silver bottom layer of FIG. 3.

A method for forming the copper conductive layer 20 on the silver bottom layer 12 comprises:

Firstly, as shown in FIG. 4, a dry film 14 is formed on the silver bottom layer 22.

Figure 5:
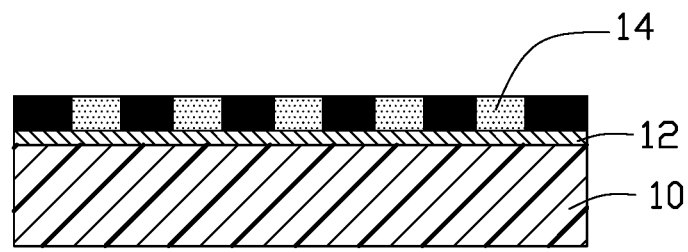
FIG. 5 is a diagrammatic view of the dry film exposed to a lithographic process.
Figure 6:
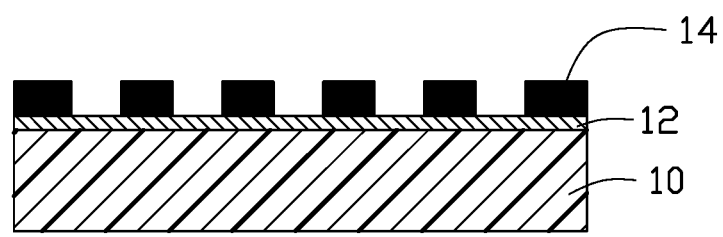
FIG. 6 is a diagrammatic view of the dry film being developed through a lithographic process.

Secondly, as shown in FIG. 5 and FIG. 6, the dry film 14 is exposed through a lithographic process to a pattern defined on the copper conductive layer 20. After exposure, the finished dry film 14 then protects the silver bottom layer 12, and the portion of the silver bottom layer 12 exposed by the dry film 14 is ready to be electroplated with a layer of copper (see next step).

Figure 7:
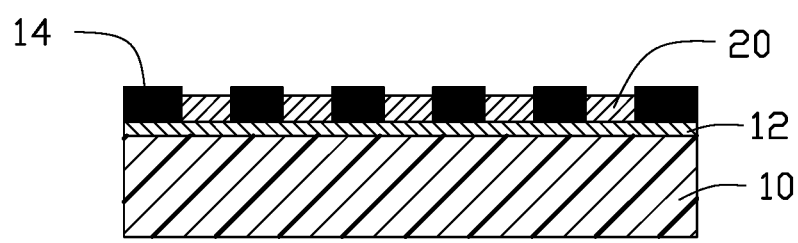
FIG. 7 is a diagrammatic view of a copper conductive layer formed on the silver bottom layer after the process of FIG. 6.

Thirdly, as shown in FIG. 7, a copper layer is electroplated onto the silver bottom layer 12, and the layer of copper becomes the copper conductive layer 20. One portion of the silver bottom layer 12 is covered by the copper conductive layer 20.

Figure 8:
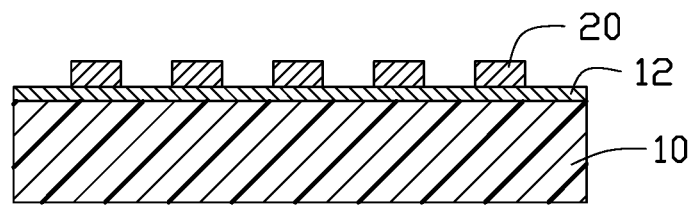
FIG. 8 is a diagrammatic view showing removal of the dry film.

Lastly, as shown in FIG. 8, the dry film 14 is removed, and the copper conductive layer 20 is in finished form on the silver bottom layer 12.

Figure 9:
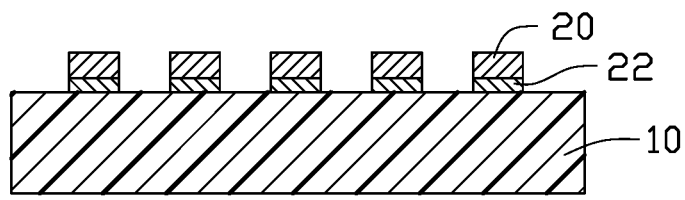
FIG. 9 is a diagrammatic view showing the silver bottom layer etched to form a silver conductive layer on the insulating sheet.

At block 204, as shown in FIG. 9, a fast vertical etching method is used to remove the silver bottom layer 12 not covered by the copper conductive layer 20. Only the silver bottom layer 12 sandwiched between the insulating sheet 10 and the copper conductive layer 20 is retained. The silver bottom layer 12 sandwiched between the insulating sheet 10 and the copper conductive layer 20 constitutes the silver conductive layer 22. In the illustrated embodiment, the silver bottom layer 12 is etched using an alkaline solution. Using an alkaline solution to fast-etch the silver bottom layer 12 means that etching only takes place along a direction perpendicular to a surface of the insulating sheet 10. Any etching which is done to a side of the copper conductive layer 20 can be ignored, so the reliability of the copper conductive layer 20 is high, and cracks or breaks in the copper conductive layer 20 are reduced.

At block 205, as shown in FIG. 10, a silver covering layer 30 is formed on a top surface and side surfaces of the copper conductive layer 20. That is to say, the copper conductive layer 20 is sandwiched between the silver covering layer 30 and the silver conductive layer 22. The silver conductive layer 22, the copper conductive layer 20, and the silver covering layer 30 together form the conductive circuit 40.

The silver covering layer 30 is formed using a sterling silver method. That is to say, in a silver solution, silver ion in the silver solution is replaced with copper comprised in the copper conductive layer 20, namely $2Ag^+ + Cu \rightarrow 2Ag + Cu^{2+}$. A silver covering layer 30 is gradually formed on the copper conductive layer 20, in this way, a thickness of the conductive circuit 40 is better controlled. A high frequency signal transmission structure 100 is thereby obtained.

The embodiments shown and described above are only examples. Therefore, many such details are neither shown nor described. Even though numerous characteristics and advantages of the present technology have been set forth in the foregoing description, together with details of the structure and function of the present disclosure, the disclosure is illustrative only, and changes may be made in the detail, including in matters of shape, size, and arrangement of the parts within the principles of the present disclosure, up to and including the full extent established by the broad general meaning of the terms used in the claims. It will therefore be appreciated that the embodiments described above may be modified within the scope of the claims.

What is claimed is:

1. A method of manufacturing a high frequency signal transmission structure, comprising:
   providing an insulating sheet, forming a silver bottom layer on the insulating sheet;
   forming a copper conductive layer on a part of the silver bottom layer;
   removing the silver bottom layer which is not covered by the copper conductive layer; and
   forming a silver covering layer on the copper conductive layer, wherein the copper conductive layer is surrounded by the silver bottom layer and the silver covering layer, the silver bottom layer, the copper conductive layer and the silver covering layer cooperatively form a conductive circuit, the copper conductive layer is a core of the conductive circuit, and the silver conductive layer and the silver covering layer cooperatively form a cladding layer wrapping the core of the conductive wiring layer.

2. The method of claim 1, wherein the silver bottom layer is formed on the insulating sheet by vacuum evaporation.

3. The method of claim 2, wherein the copper conductive layer is formed by electroplating.

4. The method of claim 3, wherein forming the copper conductive layer comprising:
   forming a dry film on the silver bottom layer;
   exposing and developing the dry film to deform a pattern of the copper conductive layer;
   electroplating a copper layer on the silver bottom layer to form the copper conductive layer, and
   removing the dry film.

5. The method of claim 1, wherein the insulating sheet is made from polyester polymer, polynaphthalene dicarboxylic acid glycol ester, polyimide, or polyterephthalate.

6. The method of claim 5, wherein the pre-treating of the surface of the insulating sheet comprising: hydrolyzing an ester group comprised in the insulating sheet is into carboxyl; and changing the carboxyl (—COOH) into ester ions (—COO—) in an alkaline environment.

7. The method of claim 1, wherein before evaporating a silver bottom layer on the insulating sheet, further comprising pre-treating a surface of the insulating sheet.

8. The method of claim 1, wherein the silver bottom layer not covered by the copper conductive layer is removed by etching with an alkaline solution.

9. The method of claim 1, wherein a thickness of the silver conductive layer is same as a thickness of the silver covering layer.

10. The method of claim 1, wherein a thickness of the silver conductive layer is approximately 0.1 μm to 2 μm.

11. The method of claim 1, wherein an electrical conductivity of the cladding layer is larger than an electrical conductivity of the core.

12. The method of claim 1, wherein the silver covering layer is formed by a sterling silver method.

13. The method of claim 1, wherein a side surface of the silver conductive layer is covered by the silver covering layer.

* * * * *